United States Patent
Smith et al.

(10) Patent No.: US 9,706,688 B2
(45) Date of Patent: Jul. 11, 2017

(54) SYSTEMS AND METHODS FOR HEAT MANAGEMENT OF AN INFORMATION HANDLING RESOURCE IN AN INFORMATION HANDLING SYSTEM

(71) Applicant: Dell Products L.P., Round Rock, TX (US)

(72) Inventors: Russell C. Smith, Taylor, TX (US); William K. Coxe, Round Rock, TX (US); Corey Dean Hartman, Hutto, TX (US); Andrew L. McAnally, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 107 days.

(21) Appl. No.: 14/474,780

(22) Filed: Sep. 2, 2014

(65) Prior Publication Data

US 2016/0066468 A1    Mar. 3, 2016

(51) Int. Cl.
*H05K 7/20* (2006.01)
*G06F 12/00* (2006.01)
*G06F 1/18* (2006.01)
*G06F 1/20* (2006.01)

(52) U.S. Cl.
CPC ............. *H05K 7/208* (2013.01); *G06F 1/185* (2013.01); *G06F 1/187* (2013.01); *G06F 1/20* (2013.01); *G06F 12/00* (2013.01)

(58) Field of Classification Search
CPC . G06F 1/183; G06F 1/20; G06F 1/186; G06F 1/187; G06F 1/16; G06F 1/181; G06F 1/185; G06F 1/206; Y10T 29/49826; Y10T 74/2101; Y10T 16/19; Y10T 16/191; Y10T 16/203; H05K 7/183; H05K 7/1489; H05K 3/301; H05K 7/1435; H05K 7/16; H05K 5/0208; H05K 5/023; H05K 7/20; H05K 7/20336
See application file for complete search history.

(56) References Cited

U.S. PATENT DOCUMENTS

| | | | | |
|---|---|---|---|---|
| 5,946,191 | A * | 8/1999 | Oyamada | H05K 7/20672 165/104.14 |
| 6,891,728 | B1 * | 5/2005 | Mease | G06F 1/183 312/333 |
| 7,428,151 | B2 * | 9/2008 | Sonnabend | G06F 1/20 361/698 |
| 7,924,565 | B2 * | 4/2011 | Huang | H05K 7/20336 165/185 |
| 8,582,306 | B2 * | 11/2013 | Hamand | H05K 5/023 312/223.1 |
| 2003/0030986 | A1 * | 2/2003 | Centola | H05K 7/20672 361/720 |
| 2007/0279858 | A1 * | 12/2007 | Grady | G06F 1/183 361/641 |

(Continued)

*Primary Examiner* — Courtney Smith
*Assistant Examiner* — Michael Matey
(74) *Attorney, Agent, or Firm* — Jackson Walker L.L.P.

(57) ABSTRACT

In accordance with embodiments of the present disclosure, a system may include a structural element and a heat pipe. The structural element may be for mechanically supporting an information handling resource. The heat pipe may be thermally and mechanically coupled to the structural element, such that the heat pipe conducts heat generated by an information handling resource supported by the structural element to the structural element.

20 Claims, 15 Drawing Sheets

(56) References Cited

U.S. PATENT DOCUMENTS

| | | | | |
|---|---|---|---|---|
| 2008/0101011 A1* | 5/2008 | Carr | .......................... | G06F 1/20 |
| | | | | 361/679.31 |
| 2011/0141685 A1* | 6/2011 | Hung | .................... | G06F 1/1632 |
| | | | | 361/679.43 |
| 2012/0099268 A1* | 4/2012 | Hartman | ................. | G06F 1/183 |
| | | | | 361/679.32 |
| 2013/0294025 A1* | 11/2013 | Davidson | .................. | G06F 1/20 |
| | | | | 361/679.32 |

* cited by examiner

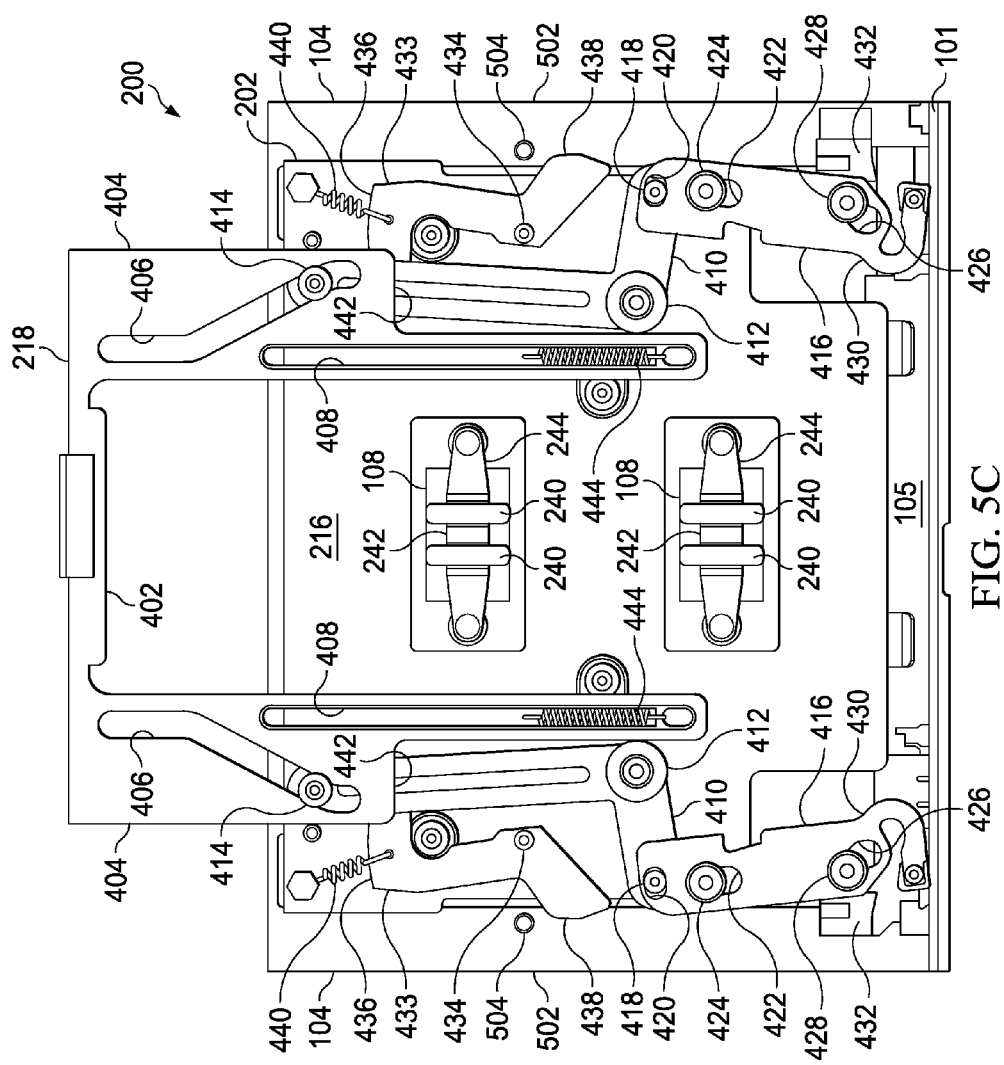

SYSTEMS AND METHODS FOR HEAT MANAGEMENT OF AN INFORMATION HANDLING RESOURCE IN AN INFORMATION HANDLING SYSTEM

TECHNICAL FIELD

The present disclosure relates to modular information handling systems. More specifically, embodiments of the disclosure provide systems and methods for insertion of an information handling resource in an information handling system, and systems and methods for heat management of such information handling resource.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Oftentimes, information handling systems and other information handling resources (e.g., storage devices, input/output devices, and other peripheral devices) are each manufactured in a modular form factor and may be configured to be disposed in a chassis configured to receive such modular components. Such a chassis and its component modular information handling systems and information handling resources typically include various rails, carriers, and other mechanical components allowing for a person to add and remove the modular information handling systems and information handling resources from the chassis.

In an information handling system, a circuit board may mechanically and electrically couple to another circuit board (e.g., a midplane or motherboard) via an edge connector that is coupled to a slot of the other circuit board, with additional mechanical support provided between the circuit board and a chassis housing components of the information handling system. Such additional support may be required where the mechanical support provided by coupling the edge connector to its corresponding slot is insufficient. For instance, in a circuit board which functions as a backplane for receiving modular memory modules, such structural attachment between circuit board and chassis may be desired to ensure proper alignment for deflection and sufficient structural support to maintain electrical coupling.

The density of components (e.g., memory modules) placed on circuit boards making up modular information handling resources continues to increase. Accordingly, mechanisms for insertion and removal of such modular information handling resources must be adapted to take into account such densities as well as space limitations of an information handling system chassis that receives the modular information handling resources. In addition, such space limitations also provide challenges to dissipating heat generated by information handling resources, to achieve high density while providing adequate heat-reducing thermal elements.

SUMMARY

In accordance with the teachings of the present disclosure, the disadvantages and problems associated with traditional modular information handling system designs and architectures may be substantially reduced or eliminated.

In accordance with embodiments of the present disclosure, a system may include a structural base, a handle mechanically coupled to the structural base, and a cam element mechanically coupled to the handle. The handle may be configured to translate between an open position and a closed position and vice versa relative to the structural base. The cam element may be configured to mechanically couple to a retention structure for retaining the system when the handle is in the closed position and during at least a portion of the translation of the handle, move at least partially in a direction opposite to that of the handle in response to translation of the handle.

In accordance with these and other embodiments of the present disclosure, a method may include mechanically coupling a handle to a structural base such that the handle is configured to translate between an open position and a closed position and vice versa relative to the structural base. The method may also include mechanically coupling a cam element to the handle such that the cam element is configured to mechanically couple to a retention structure for retaining the structural base when the handle is in the closed position and during at least a portion of the translation of the handle, move at least partially in a direction opposite to that of the handle in response to translation of the handle.

In accordance with these and other embodiments of the present disclosure, an information handling system may include a chassis and an information handling resource. The chassis may include one or more bays each configured to receive an information handling resource assembly, each bay having a retention structure for retaining an information handling resource assembly. The information handling resource assembly may be disposed in one of the one or more bays, and may include a structural base, a handle mechanically coupled to the structural base, and a cam element mechanically coupled to the handle. The handle may be configured to translate between an open position and a closed position and vice versa relative to the structural base. The cam element may be configured to mechanically couple to the retention structure when the handle is in the closed position and during at least a portion of the translation of the handle, move at least partially in a direction opposite to that of the handle in response to translation of the handle.

In accordance with these and other embodiments of the present disclosure, a system may include a structural element and a heat pipe. The structural element may be for mechanically supporting an information handling resource. The heat pipe may be thermally and mechanically coupled to the structural element, such that the heat pipe conducts heat generated by an information handling resource supported by the structural element to the structural element.

In accordance with these and other embodiments of the present disclosure, a method may include providing a structural element for mechanically supporting an information handling resource. The method may also comprise thermally and mechanically coupling a heat pipe to the structural element, such that the heat pipe conducts heat generated by an information handling resource supported by the structural element to the structural element.

In accordance with these and other embodiments of the present disclosure, an information system may include a chassis and an information handling resource. The chassis may include one or more bays each configured to receive an information handling resource assembly. The information handling resource assembly may be disposed in one of the one or more bays, the information handling resource assembly comprising a structural element for mechanically supporting an information handling resource and a heat pipe thermally and mechanically coupled to the structural element, such that the heat pipe conducts heat generated by an information handling resource supported by the structural element to the structural element.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIGS. 5A-5G illustrate elevation views of the memory riser assembly shown in FIGS. 2-4, with certain components omitted, depicting insertion of the memory riser assembly into a chassis, in accordance with embodiments of the present disclosure;

DETAILED DESCRIPTION

Preferred embodiments and their advantages are best understood by reference to FIGS. 1-8B, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

In this disclosure, the term "information handling resource" may broadly refer to any component system, device or apparatus of an information handling system, including without limitation processors, buses, memories, input-output devices and/or interfaces, storage resources, network interfaces, motherboards, electro-mechanical devices (e.g., fans), displays, and power supplies.

As used herein, the term "circuit board" may broadly refer to printed circuit boards (PCBs), printed wiring boards (PWBs), printed wiring assemblies (PWAs), etched wiring boards, and/or any other board or similar physical structure operable to mechanically support and electrically couple electronic components. A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

Figure 1:
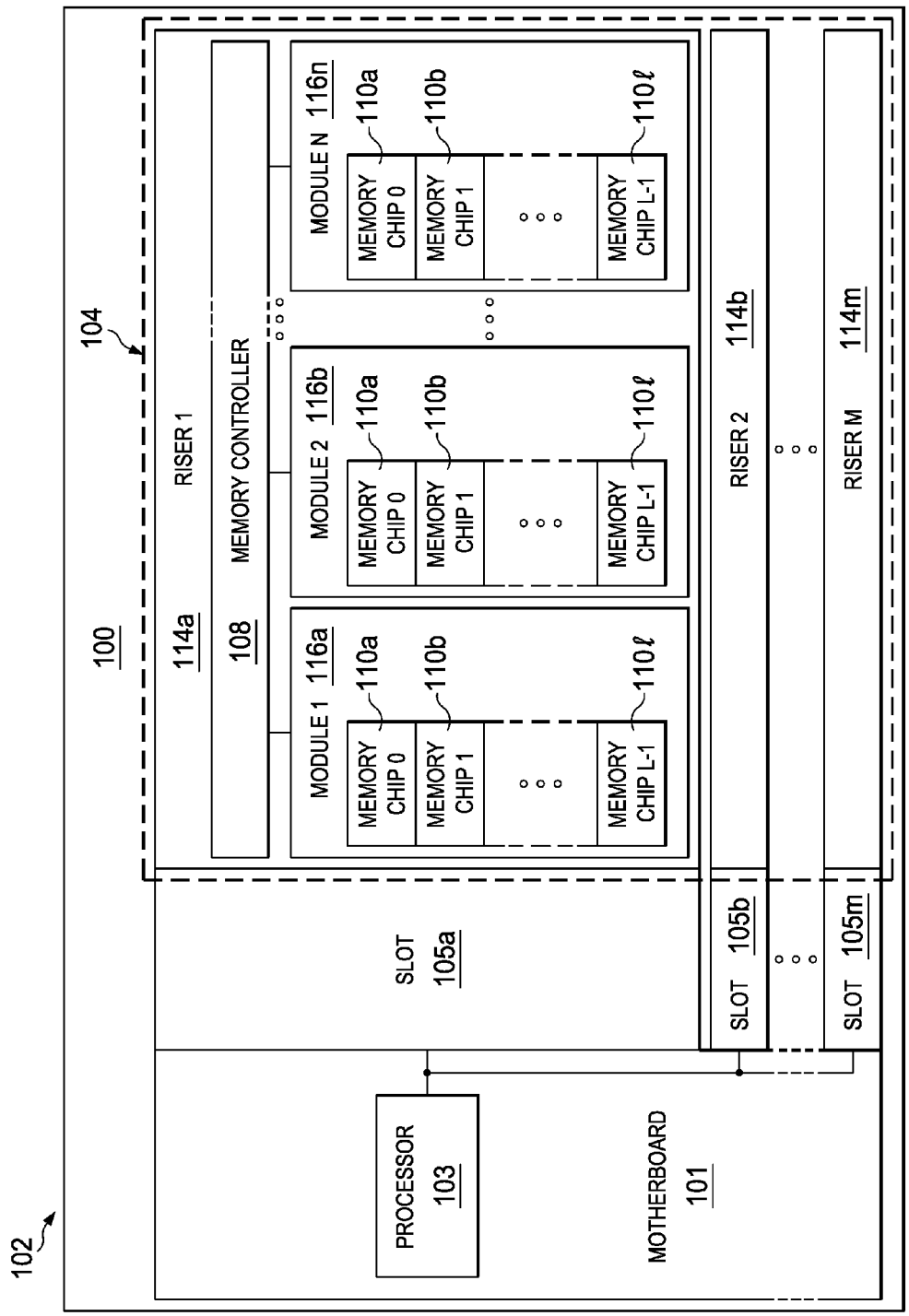
FIG. 1 illustrates a block diagram of selected components of an example information handling system, in accordance with embodiments of the present disclosure.

FIG. 1 illustrates a block diagram of an example information handling system 102 in accordance with certain embodiments of the present disclosure. In some embodiments, information handling system 102 may comprise a server for housing one or more modular information handling systems or "blades." In other embodiments, information handling system 102 may comprise a personal computer (e.g., a desktop computer or a portable computer). As depicted in FIG. 1, information handling system 102 may include a chassis 100 housing a motherboard 101 and a memory system 104 communicatively coupled to motherboard 101 via one or more slots 105.

Chassis 100 may comprise an enclosure that serves as a container for one or more information handling systems and information handling resources, and may be constructed from steel, aluminum, plastic, and/or any other suitable material. Although the term "chassis" is used, chassis 100 may also be referred to as a case, cabinet, tower, box, enclosure, and/or housing. In some embodiments, chassis 100 may be configured to hold and/or provide power to a plurality of information handling systems and/or information handling resources.

Motherboard 101 may include a circuit board configured to provide structural support for one or more information handling resources of information handling system 102 and/or electrically couple one or more of such information handling resources to each other and/or to other electric or electronic components external to information handling system 102. As shown in FIG. 1, motherboard 101 may include a processor 103 and one or more slots 105 (e.g., slots 105a-105m) communicatively coupled to processor 103 (e.g., via a communication bus).

Processor 103 may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored and/or communicated by one or more of memory system 104 and/or another component of information handling system 102.

A memory slot 105 may include any system, device, or apparatus configured to receive a memory riser 114 in order to electrically couple such memory riser 114 and components thereof to processor 103. Thus, memory slot 105 may comprise an electrical/electronic connector configured to engage with a corresponding electrical/electronic connector of a riser 114.

Memory system 104 may be communicatively coupled to processor 103 via the one or more memory slots 105 and may comprise any system, device, or apparatus operable to retain program instructions or data for a period of time (e.g., computer-readable media). Memory system 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off. In particular embodiments, memory system 104 may comprise dynamic random access memory (DRAM).

As shown in FIG. 1, memory system 104 may include a plurality of memory risers 114 (e.g., memory risers 114a-114m). Each memory riser 114 may comprise a circuit board having mounted thereon one or more memory controllers 108 and configured to receive one or more memory modules 116 (e.g., memory modules 116-116n). In some embodiments, a memory riser 114 may be a modular component which may be easily inserted into and removed from a corresponding slot 105 by a technician or other user of information handling system 102. Accordingly, a memory riser 114 may include mechanical components for facilitating such insertion and removal, as is described in greater detail below in this disclosure. In these and other embodiments, a memory riser 114 may include thermal components for cooling or directing heat away from other components (e.g., memory controllers 108 and/or memory modules 116) disposed on such memory riser 114, as is described in greater detail below in this disclosure.

A memory controller 108 may comprise any system, device, or apparatus configured to manage and/or control its associated memory riser 114. For example, memory controller 108 may be configured to read data from and/or write data to memory modules 116 comprising its associated memory riser 114. Additionally or alternatively, memory controller 108 may be configured to refresh memory modules 116 and/or memory chips 110 thereof in embodiments in which a memory riser 114 comprises DRAM. Although memory controller 108 is shown in FIG. 1 as an integral component of a memory riser 114, memory controller 108 may be separate from a memory riser 114 and/or may be an integral portion of another component of information handling system 102 (e.g., memory controller 108 may be integrated into processor 103 or disposed on motherboard 101).

Each memory module 116 may comprise a circuit board having mounted thereon one or more memory chips 110 (e.g., memory chips 110a-110l). In some embodiments, a memory module 116 may be a modular component which may be easily inserted into and removed from a corresponding slot of a memory riser 114 by a technician or other user of information handling system 102. Thus, to remove a particular memory module 116, a technician or other user of information handling system 102 may first remove from information handling system 102 a memory riser 114 in which the particular memory module 116 is disposed, and then remove the particular memory module 116 from such memory riser 114.

Each memory chip 110 may include a packaged integrated circuit configured to comprise a plurality of memory cells for storing data. In some embodiments, a memory chip 110 may include dynamic random access memory (DRAM).

Figure 2:
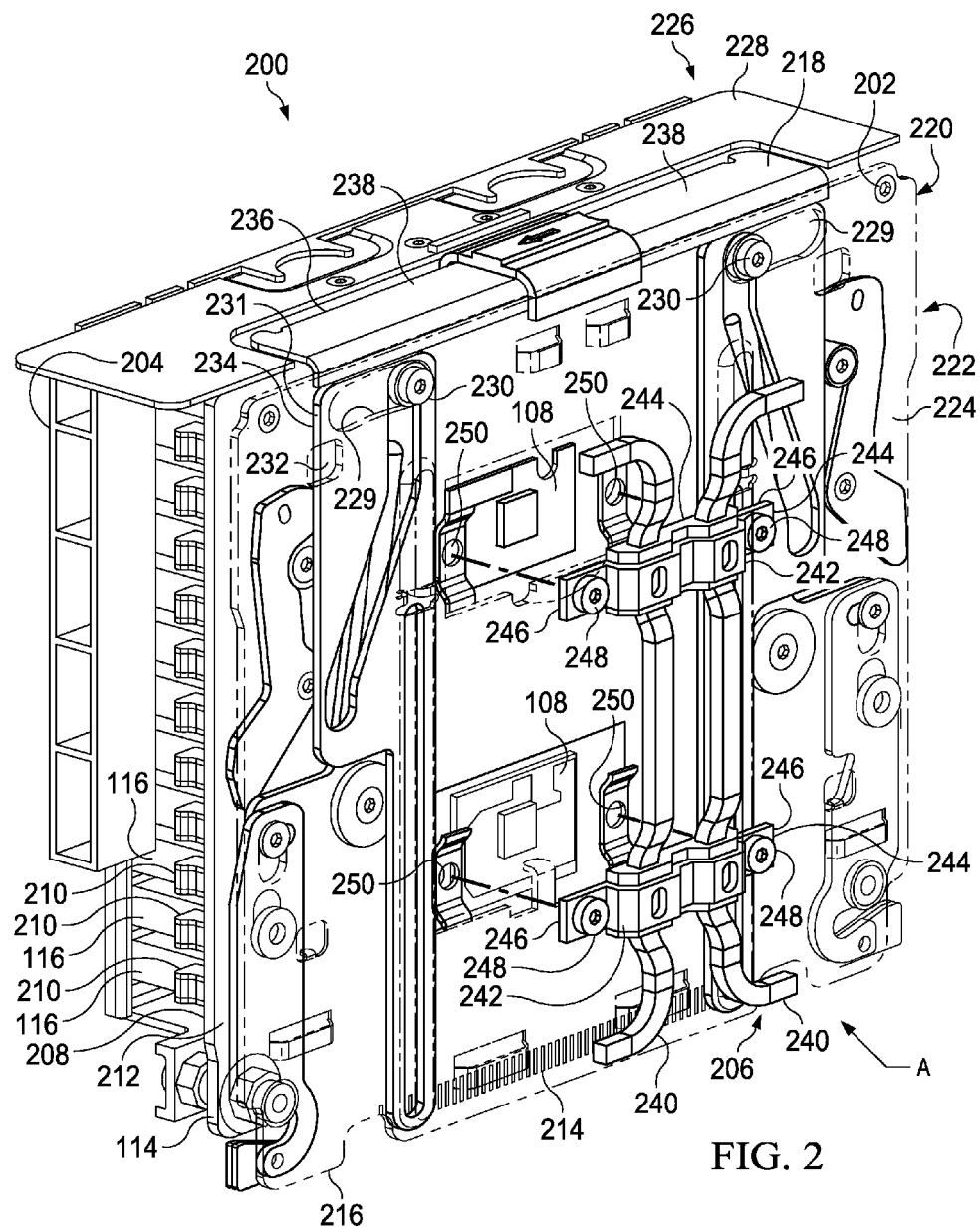
FIG. 2 illustrates a perspective view of a memory riser assembly, in accordance with embodiments of the present disclosure.

FIG. 2 illustrates a perspective view of a memory riser assembly 200, in accordance with embodiments of the present disclosure. As described in greater detail below, riser assembly 200 may comprise features that facilitate a technician or other user's insertion and/or removal of a memory riser 114 into and/or from a corresponding memory slot 105. As shown in FIG. 2, memory riser assembly 200 may comprise a memory riser 114 mechanically coupled to a riser caddy 202, a memory module cover 204 mechanically coupled to riser caddy 202, and a heat pipe assembly 206 mechanically coupled to riser caddy 202.

As shown in FIG. 2, memory riser 114 may comprise a primary side 208 having disposed thereon one or more slots 210, each slot 210 for receiving a corresponding memory module 116. In addition, memory riser 114 may comprise a secondary side 212 opposite primary side 208 having disposed thereon one or more memory controllers 108. Thus, the one or more memory controllers 108 may be electrically coupled to slots 210 by way of vias or other conductive elements passing through the circuit board comprising memory riser 114. Furthermore, memory riser 114 may include an edge connector 214 or other suitable connector for electrically coupling memory riser 114 to a corresponding slot 105.

Riser caddy 202 may comprise any suitable mechanical system for facilitating insertion or removal a memory riser 114 into or from a slot 105. As depicted in FIG. 2, riser caddy 202 may comprise, among other features, a base 216 and a handle 218. Base 216 may be constructed from steel, aluminum, and/or any other suitable material that provides both mechanical structure and thermal conductivity. Base 216 may comprise a bottom portion 220 having a primary side 222 and a secondary side 224 opposite primary side 222. Base 216 may also include a top portion 226 having a face 228 substantially perpendicular to primary side 222 such that when memory riser assembly 200 is fully inserted into chassis 100, face 228 sits substantially parallel to an exterior surface of chassis 100.

Handle 218 may be mechanically coupled to base 216 via bearings 230 at openings of base 216 and may include a U-shaped bottom portion 231 having a primary side 232 and a secondary side 234 opposite primary side 232 such that primary side 232 and secondary side 234 are substantially parallel to primary side 222 and secondary side 224 of base 216, and such that when memory riser assembly 200 is fully inserted into chassis 100, secondary side 234 of handle 218 faces primary side 224 of base 216. Handle 218 may also include a front portion 236 having a face 238 substantially perpendicular to primary side 232 such that when memory riser assembly 200 is fully inserted into chassis 100, face 238 sits substantially parallel to an exterior surface of chassis 100 and/or substantially parallel to face 228 of base 216. Advantageously, the U-shape of handle 218 may allow for greater density of components in memory riser assembly 200, such as, for example, space on secondary side 212 of memory riser 114 for memory controllers 108 and/or heat pipe assembly 206.

Although not shown with reference numerals in FIG. 2 for purposes of clarity and exposition, riser caddy 202 may also include various features formed in base 216, formed in handle 218, and/or mechanically coupled to base 216 and/or handle 218 for facilitating removal and/or insertion of memory riser 114 from and/or to information handling system 102, as is described in greater detail below in this disclosure.

Memory module cover 204 may be mechanically coupled to memory riser caddy 202 and/or memory riser 114 and may include, as is known in the art, any suitable structure for covering or enclosing memory modules 116 within memory riser 114.

Although shown in FIG. 2 as exploded from the remainder of memory riser assembly 200, heat pipe assembly 206 may be mechanically coupled to memory riser 114 and base 216. For instance, as depicted in FIG. 2, heat pipe assembly 206 may include one or more heat pipes 240, one or more conductive blocks 242, and one or more brackets 244.

A heat pipe 240 may comprise any suitable device or apparatus constructed from a thermally-conductive material (e.g., copper) capable of transferring heat from a heat-generating information handling resource (e.g., from a surface of a memory controller 108) in order to reduce or control a temperature of such information handling resource. In some embodiments, one or more heat pipes 240 may be soldered or otherwise mechanically coupled to base 216.

A conductive block 242 may be mechanically coupled to one or more heat pipes 240 and may comprise any suitable device or apparatus constructed from a thermally-conductive material (e.g., copper) and sized and shaped as to maximize the area of a thermally conductive interface between a heat-generating information handling resource (e.g., a surface of a memory controller 108) and heat pipe assembly 206. In some embodiments, one or more conductive blocks 242 may be soldered to heat pipes 240.

A bracket 244 may be mechanically coupled to one or more heat pipes 240 in any suitable manner. For example, as shown in FIG. 2, a bracket 244 may have one or more openings 246, each opening configured to receive a fastener 248 (e.g., a screw) for coupling heat pipe assembly 206 to base 216 and/or memory riser 114. In some embodiments, memory riser 114 may include standoffs 250 of some other threaded component for receiving a corresponding fastener 248 in order to mechanically couple bracket 244 to memory riser 114. In some embodiments, bracket 244 may have a spring force to mechanically bias conductive blocks 242 towards memory controllers 108. Thus, bracket 244 and fasteners 248 may create mechanical loading which ensures thermal contact between a memory controller 108 and a conductive block 242, such that heat generated by such memory controller 108 is dissipated through heat pipes 240 via conductive blocks 242. In turn, due to the thermal interface between heat pipes 240 and base 216, base 216 may act as a heat spreader, providing additional surface area in which to dissipate heat from memory controllers 108. Thus, base 216 may serve not only as a structural component for memory riser 114, but may also serve as a thermal element for dissipating heat. Accordingly, by combining such functionality, heat-dissipating structures (e.g., heat sinks coupled to memory controllers 108) that might otherwise be required may instead not be used, thus saving space.

Figure 3:
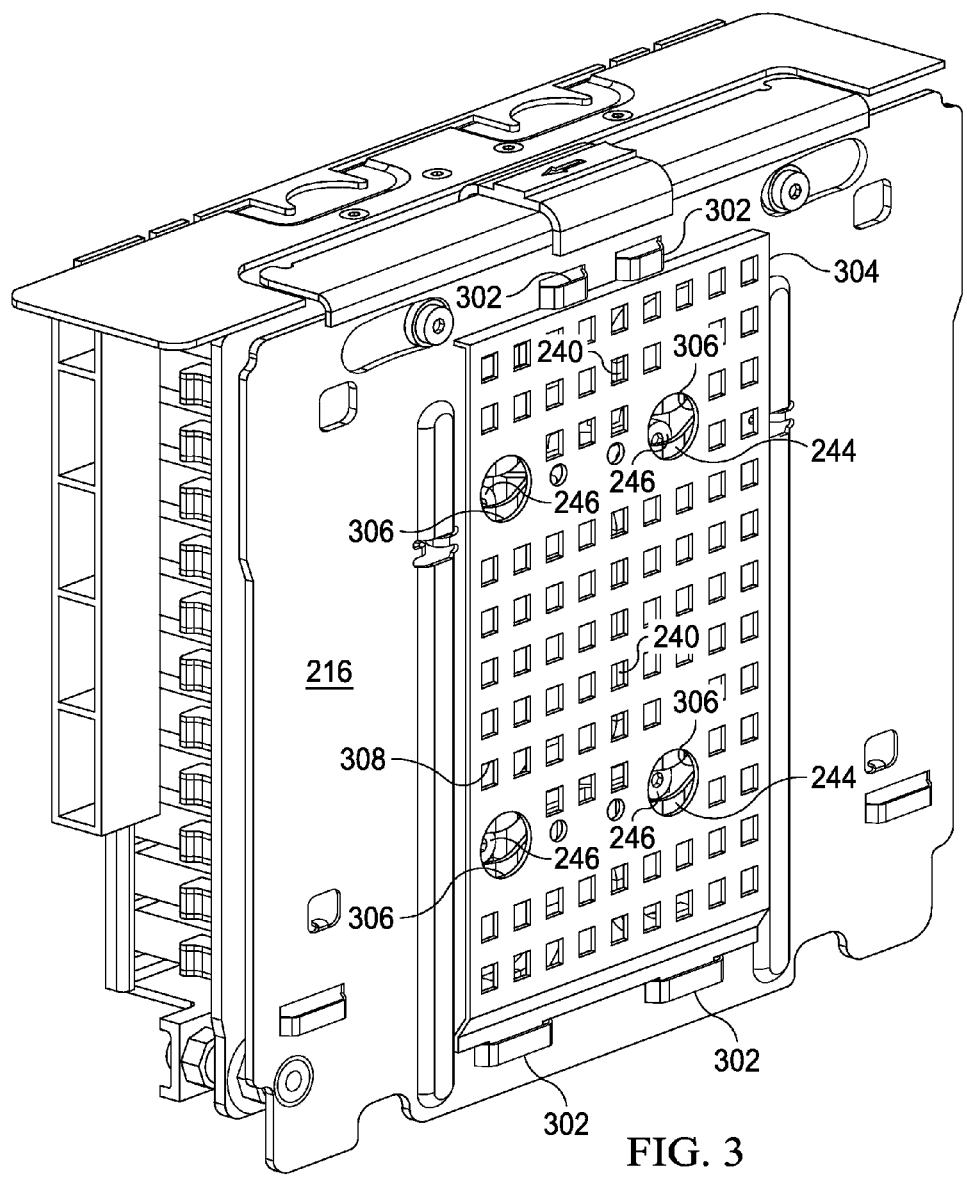
FIG. 3 illustrates a perspective view of the memory riser assembly shown in FIG. 2, with a heat sink protection screen present, in accordance with embodiments of the present disclosure.

FIG. 3 illustrates a perspective view of memory riser assembly 200 shown in FIG. 2, with a heat sink protection screen 304 present, in accordance with embodiments of the present disclosure. During operation of memory riser assembly 200, heat pipes 240 may rise to temperatures which may be unsafe for handling by a technician or other user. Thus, to protect such user from burns or other injury from heat pipes 240, memory riser assembly 200 may, in some embodiments, include heat sink protection screen 304 configured to cover heat pipes 240 and provide a protective boundary between a user and heat pipes 240. As shown in FIG. 3, base 216 may include retention features 302 that may be configured to receive corresponding flanges (not explicitly referenced in FIG. 3) of heat sink protection screen 304. Heat sink protection screen 304 may include openings 306 such that a manufacturer of memory riser 200 may have access to openings 246 of brackets 244 in order to mechanically couple heat pipe assembly 206 to memory riser 114 via a fastener 248 (not shown in FIG. 3). In addition, heat sink protection screen 304 may also include vent openings 308 to permit air flow from one side of heat sink protection screen 304 to the other, such that air may flow over heat pipes 240 to cool them. In some embodiments, heat sink protection screen 304 may be mechanically coupled to one or more brackets 244 via a weld, adhesive, or fastener.

Figure 4:
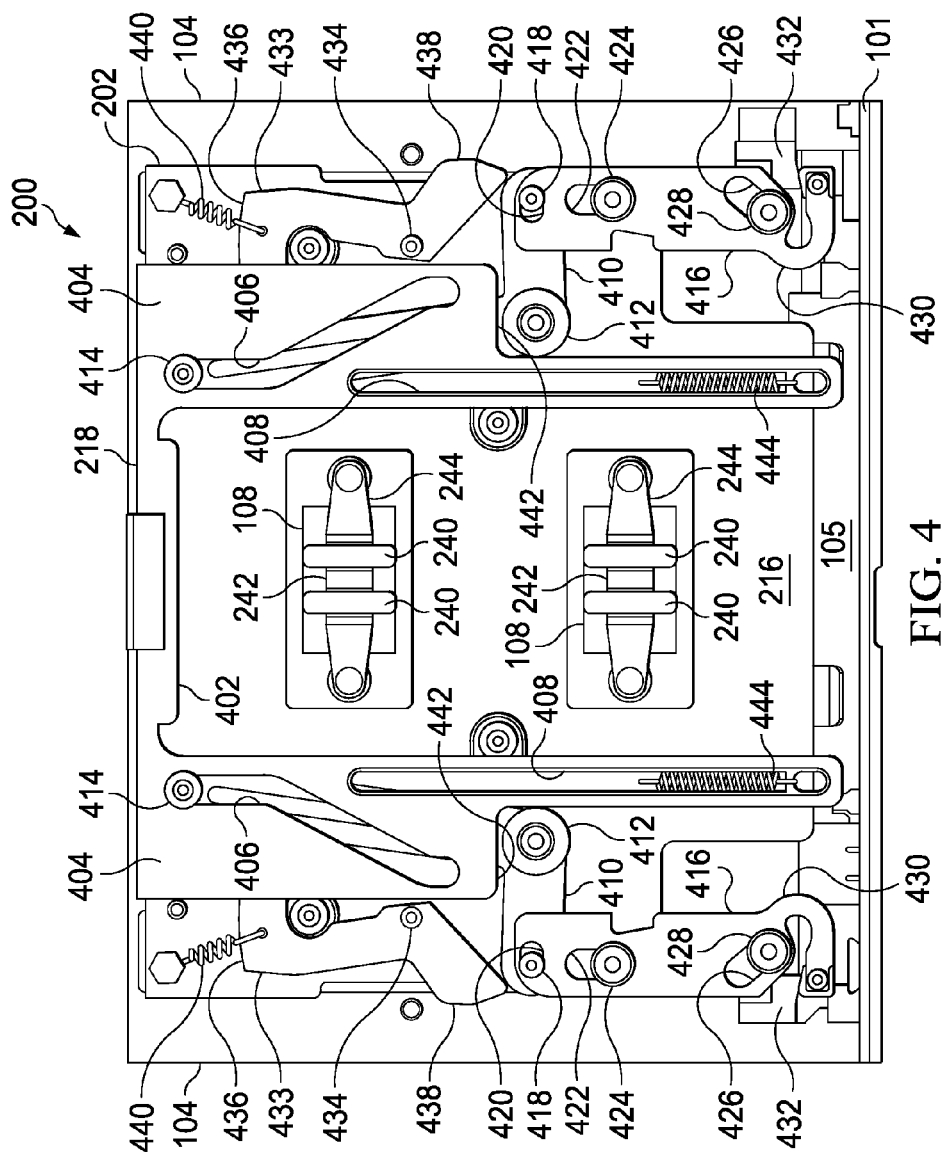
FIG. 4 illustrates an elevation view of the memory riser assembly shown in FIGS. 2 and 3, with certain components omitted, in accordance with embodiments of the present disclosure.

FIG. 4 illustrates an elevation view of memory riser assembly 200 viewed in the direction A indicated in FIG. 2, with base 216 and portions of heat pipes 240 omitted for purposes of clarity and exposition, in accordance with embodiments of the present disclosure. As shown in FIG. 4, memory riser caddy 202 may comprise components for facilitating removal and/or insertion of memory riser 114 from/into slot 105, including handle 218, one or more L-shaped arms 410, one or more cam links 416, and one or more lockout arms 433.

As described earlier, handle 218 may generally be U-shaped. Accordingly, handle 218 may comprise two generally parallel handle arms 404 having a spaced relationship from each other, the two handle arms 404 coupled to a crossbar 402 extending at least between the handle arms 404 and generally parallel to the handle arms 404. As depicted in FIG. 4, crossbar 402 and handle arms 404 may be formed from the same piece of material. Also as depicted in FIG. 4, each handle arm 404 may have formed therein a spring slot 408 and a driver slot 406. A spring slot 408 may provide an opening through which a spring 444 may couple a handle arm 404 to primary side 222 of base 216. A spring slot 408 may also have a length in a direction generally parallel to handle arm 404. Such one or more springs 444 may apply a spring force to handle 218 to bias handle in at least a partially open position relative to base 216 in the absence of a force counteracting the spring force.

A driver slot 406 may include two non-parallel straight portions, such that driver slots 406 are substantially parallel to each other and parallel to the direction of motion of handle 218 at the ends of driver slots 406 nearest crossbar 402, but increase in distance from each other approaching their ends farthest from crossbar 402.

Each driver slot 406 may couple handle 218 to a corresponding L-shaped arm 410 via a bearing 414, such that bearing 414 may translate over the length of its corresponding driver slot 406 as handle 218 translates between an open position and a closed position (e.g., in a downward direction relative to the view depicted in FIG. 4) and vice versa. In addition, each L-shaped arm 410 may be coupled via a bearing 414 at an opening 229 of FIG. 2 as shown in FIG. 2. Each L-shaped arm may be coupled to primary side 222 of base 216 via a rotational pivot 412. Accordingly, as bearing 414 is translated over the portion of a driver slot 406 which is not parallel to the direction of motion of handle 218, L-shaped arm 410 may rotate about pivot 412. For example, as handle 218 is translated from a closed position to an open position relative to base 216 (e.g., in an upward direction relative to the view depicted in FIG. 4), the leftmost L-shaped arm 410 may rotate in a counterclockwise manner about its respective pivot 412 while the rightmost L-shaped arm 410 may rotate in a clockwise manner about its respective pivot 412 relative to the view depicted in FIG. 4. Similarly, as handle 218 is translated from an open position to a closed position relative to base 216 (e.g., in a downward direction relative to the view depicted in FIG. 4), the leftmost L-shaped arm 410 may rotate in a clockwise manner about its respective pivot 412 while the rightmost L-shaped arm 410 may rotate in a counterclockwise manner about its respective pivot 412 relative to the view depicted in FIG. 4.

A cam link 416 may be mechanically coupled at a drive slot 420 to a corresponding L-shaped arm 410 via a bearing 418, such that cam link 416 is mechanically coupled its corresponding L-shaped arm 410 at an end of L-shaped arm 410 opposite from an end of L-shaped arm 410 which is mechanically coupled to handle 218. In addition, a cam link 416 may be mechanically coupled to primary side 222 of base 416 at a first guide slot 422 via a bearing 424 and at a second guide slot 426 via a bearing 428. First guide slot 422 may be generally parallel to the direction of motion of handle 218, while second guide slot 426 may be non-parallel to the direction of motion of handle 218. Accordingly, as handle 218 is translated from a closed position to an open position relative to base 216 (e.g., in an upward direction relative to the view depicted in FIG. 4), rotation of an L-shaped arm 410 may cause its corresponding cam link 416 to move generally in a direction away from face 228 of caddy tray 202 (e.g., in a downward direction relative to the view depicted in FIG. 4). Thus, when inserting memory riser assembly 200 into chassis 100, translation of handle 218 from the open position to the closed position may cause a cam leg 430 of a cam link 416 to engage to a corresponding retention structure 432 mechanically coupled to motherboard 101, such that a mechanical force between cam leg 430 and retention structure 432 maintains memory riser assembly 200 in chassis 100 and maintains mechanical and electrical coupling between memory riser 114 and slot 105. On the other hand, when removing memory riser assembly 200 from chassis 100, translation of handle 218 from the closed position to the open position may cause a cam leg 430 to disengage from a corresponding retention structure 432, thus permitting removal of memory riser assembly 200.

Due to the reversing mechanism of an L-shaped arm 410 and its corresponding cam arm 416, which causes a cam leg 430 to generally move in a direction opposite that of handle 218, retention features of memory riser assembly 200 may reside entirely within the outline/footprint of memory riser 114, thus reducing space needed to provide retention of memory riser assembly 200 in chassis 100.

A lockout arm 433 may be mechanically coupled to primary side 222 of base 216 via a rotational pivot 434 and may be coupled to memory riser 114 or another component of memory riser assembly 200 via a corresponding spring 440. Spring 440 may mechanically bias its corresponding lockout arm 433 such that lockout arm 233 is biased to rotate about pivot 434 into a biased position in the absence of an opposite force preventing rotation into such biased position. For example, the leftmost lockout arm 433 may be biased by its corresponding spring 440 to rotate in a clockwise position about its respective pivot 434, while the rightmost lockout arm 433 may be biased by its corresponding spring 440 to rotate in a counterclockwise position about its respective pivot 434 relative to the view depicted in FIG. 4. At a point during translation of handle 218 from a closed position to an open position relative to base 216 (e.g., in an upward direction relative to the view depicted in FIG. 4), the spring force provided by a spring 440 may force lockout arm 433 into its biased position and cause a first end 436 of its associated lockout arm 433 to engage with a lockout feature (e.g., edge 442) of a corresponding handle arm 404 which may prevent closure of handle 218 relative to base 216 in the absence of a force opposing the spring force of spring 440. On the other hand, at a point during translation of handle 218 from an open position to a closed position relative to base 216 (e.g., in a downward direction relative to the view depicted in FIG. 4), a lockout-releasing feature of chassis 100 (not depicted in FIG. 4 but depicted in FIGS. 5A-5G) may engage with a second end 438 of lockout arm 433 opposite from first end 436 in order to overcome the spring force of spring 440, thus causing first end 436 to disengage from the lockout feature (e.g., edge 442) of handle 218 such that handle 216 may be translated relative to base 218.

Such lockout mechanism allows for riser assembly 200 to be almost fully inserted into a corresponding bay of chassis 100 before handle 218 translates relative to base 216, thus providing a technician or other user a structural component in which to drive riser assembly 200 into its corresponding bay. This lockout mechanism may also ensure that cam leg 430 is aligned with a corresponding retention structure 432 before handle translates relative to base 216. During insertion, and after the lockout feature (e.g., edge 442) of lockout arm 433 has engaged with a lock-releasing feature of chassis 100, handle 218 may then be translated relative to base 216, such that L-shaped arm 410 and cam arm 416 which are driven by the motion of handle 218 relative to base 216 may cause cam leg 430 to engage with a corresponding retention structure 432, thus maintaining memory riser assembly 200 in chassis 100. In FIG. 4 and other figures herein, many features of riser caddy 202 are shown as being mechanically coupled to primary side 222 of base 216. However, in some embodiments, some or all of such features may be mechanically coupled to secondary side 224 of base 216.

Figure 5A:
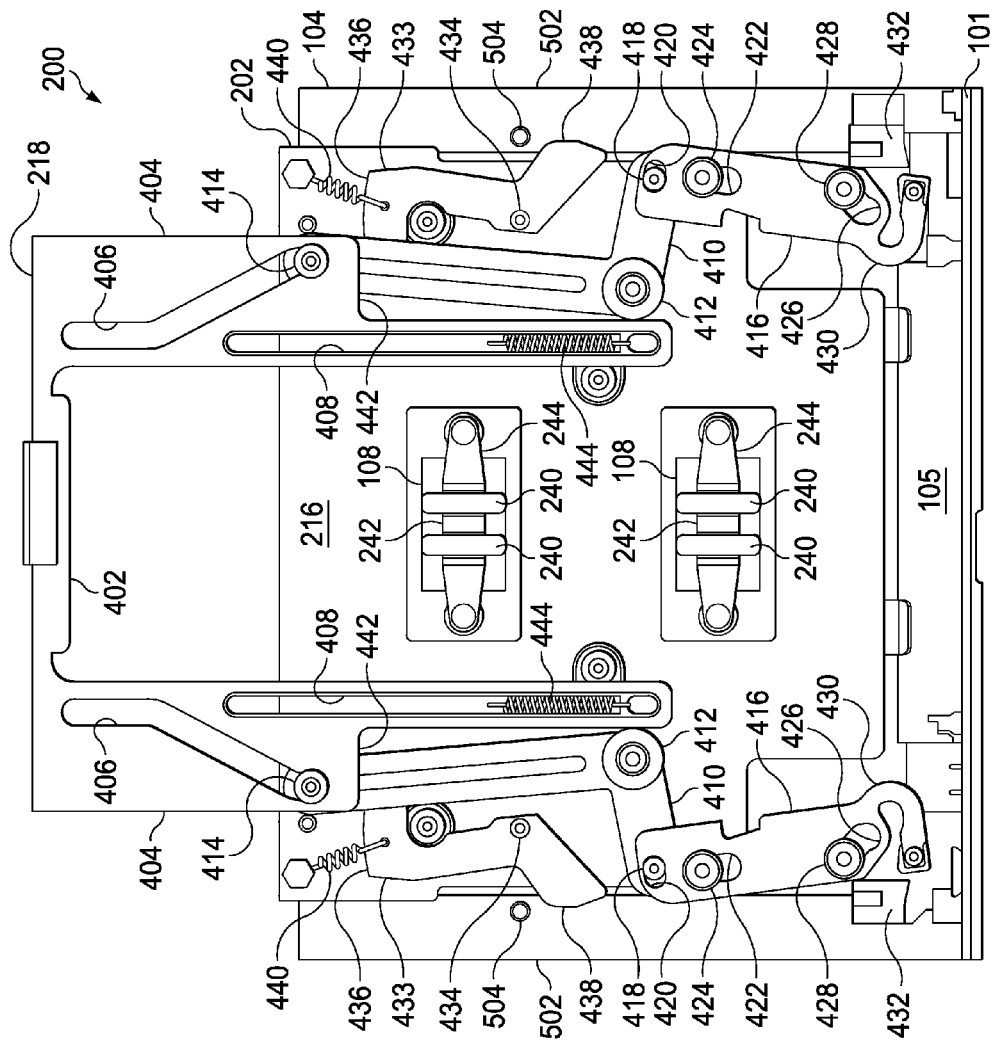
Figure 5B:
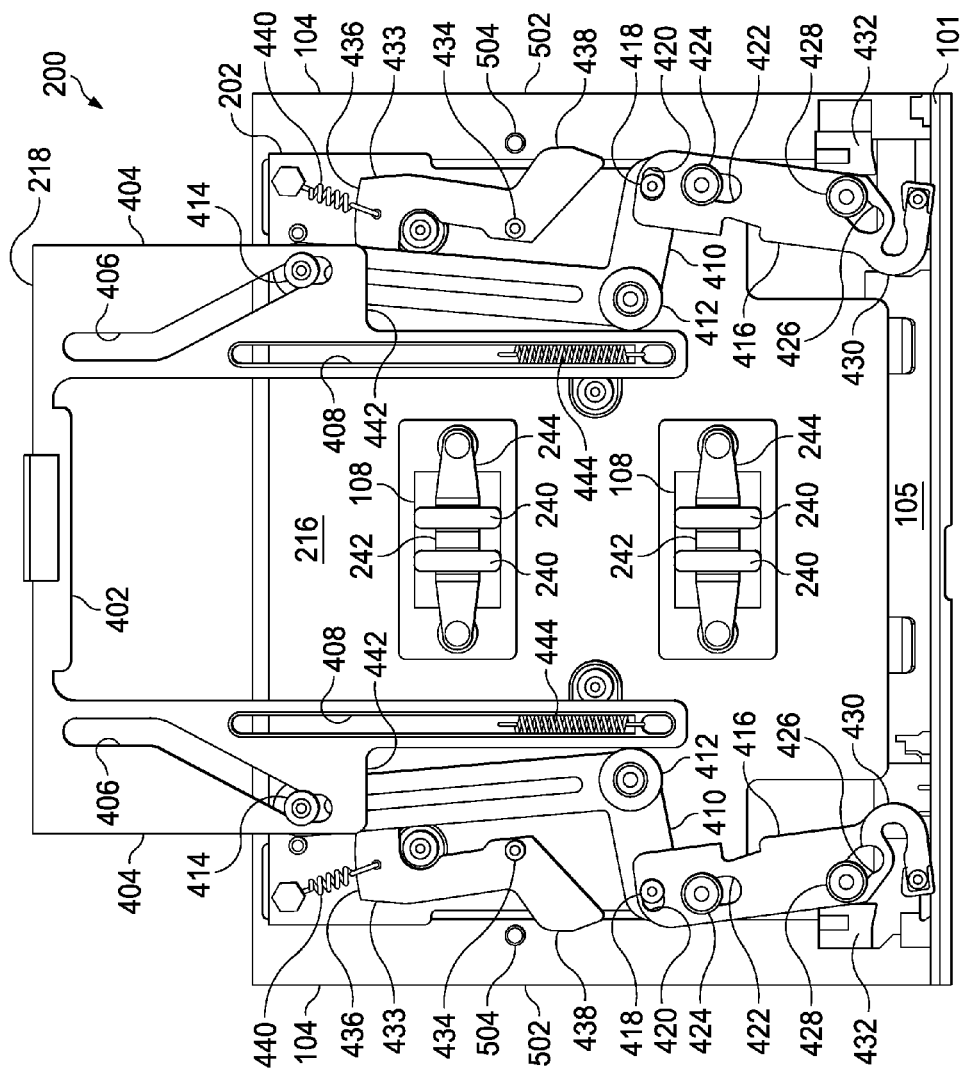
Figure 5D:
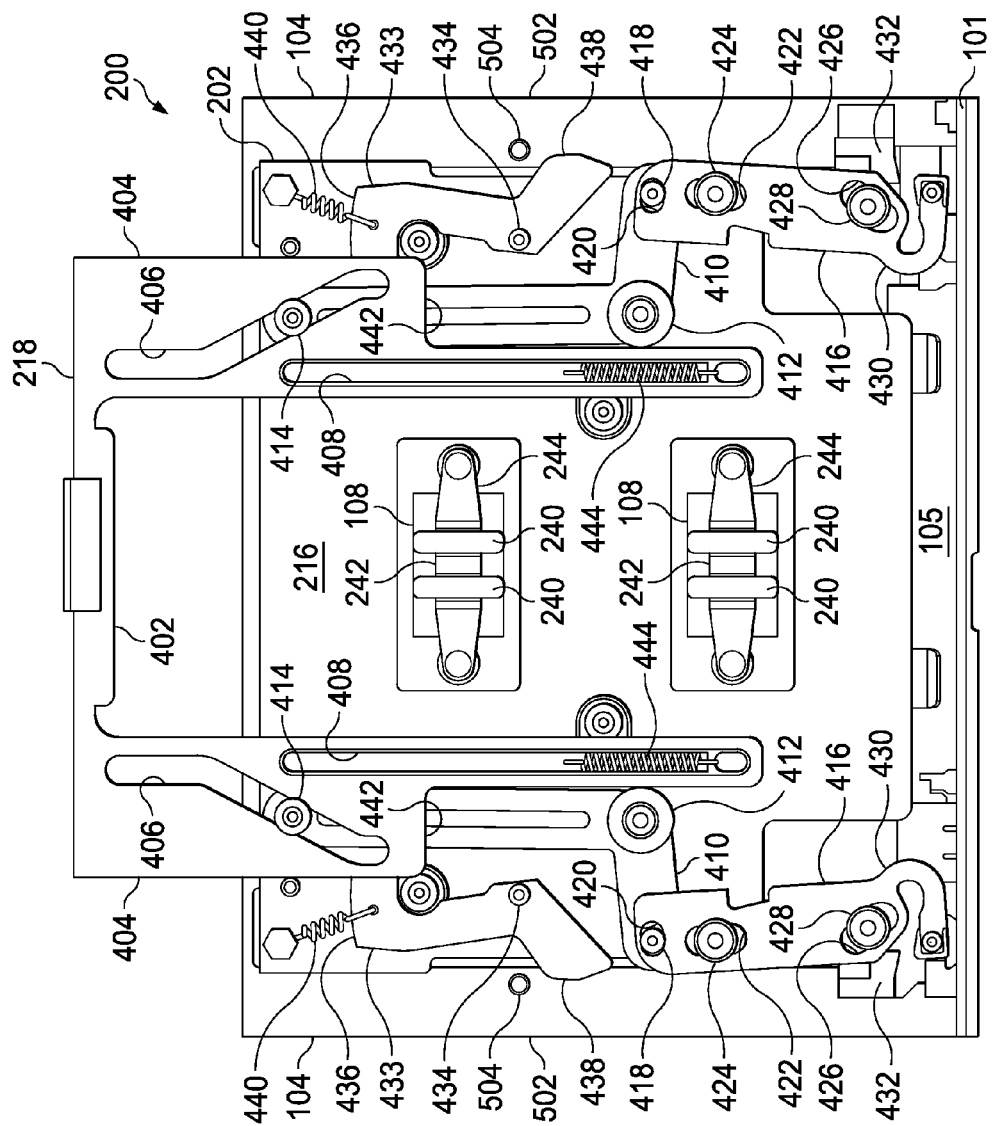
Figure 5E:
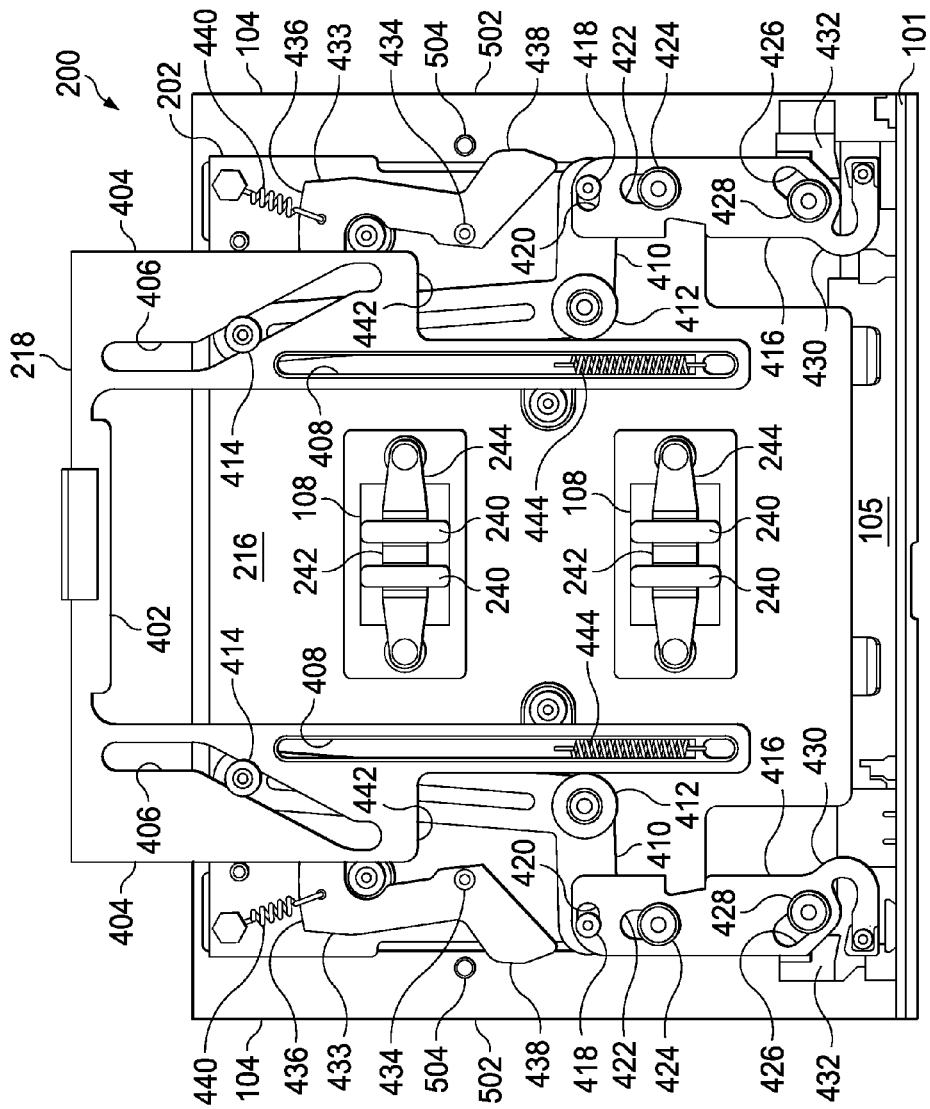
Figure 5F:
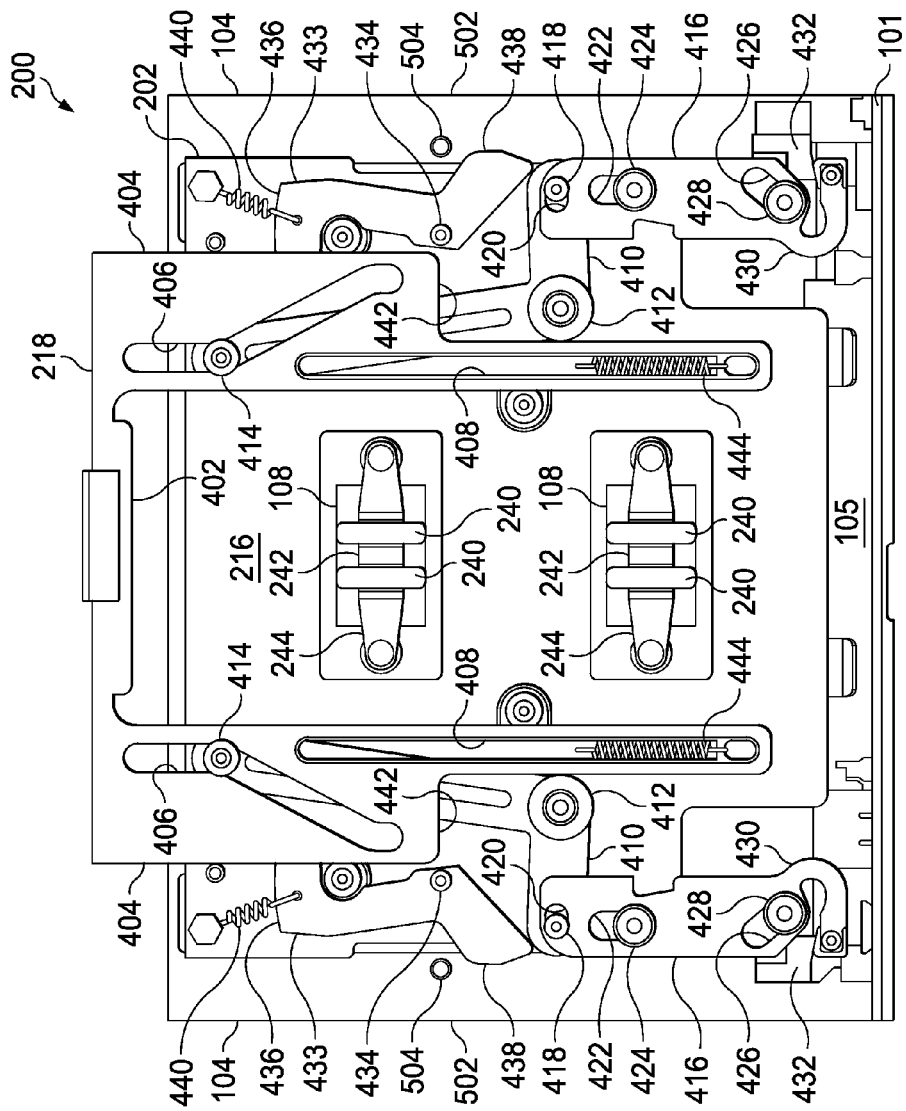
Figure 5G:
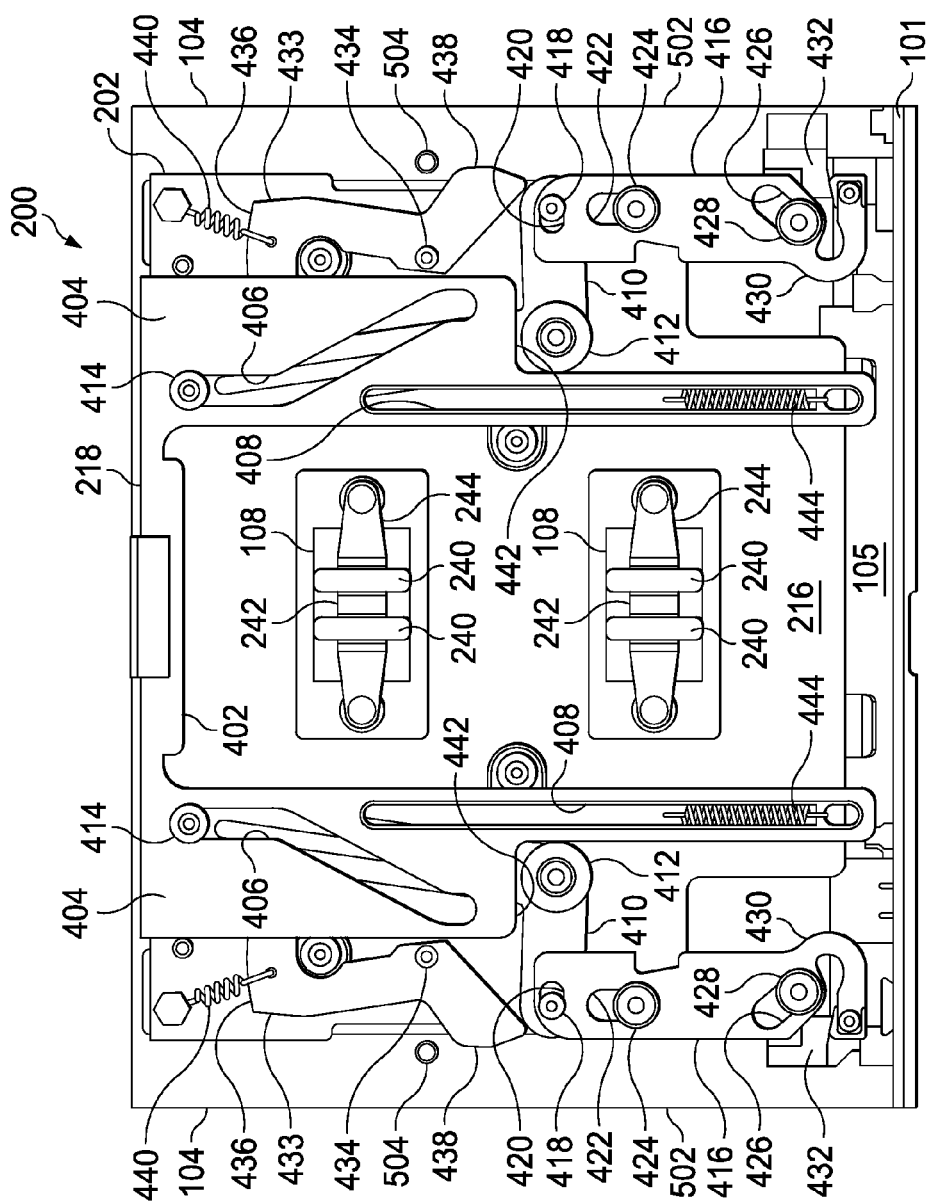
Figure 6:
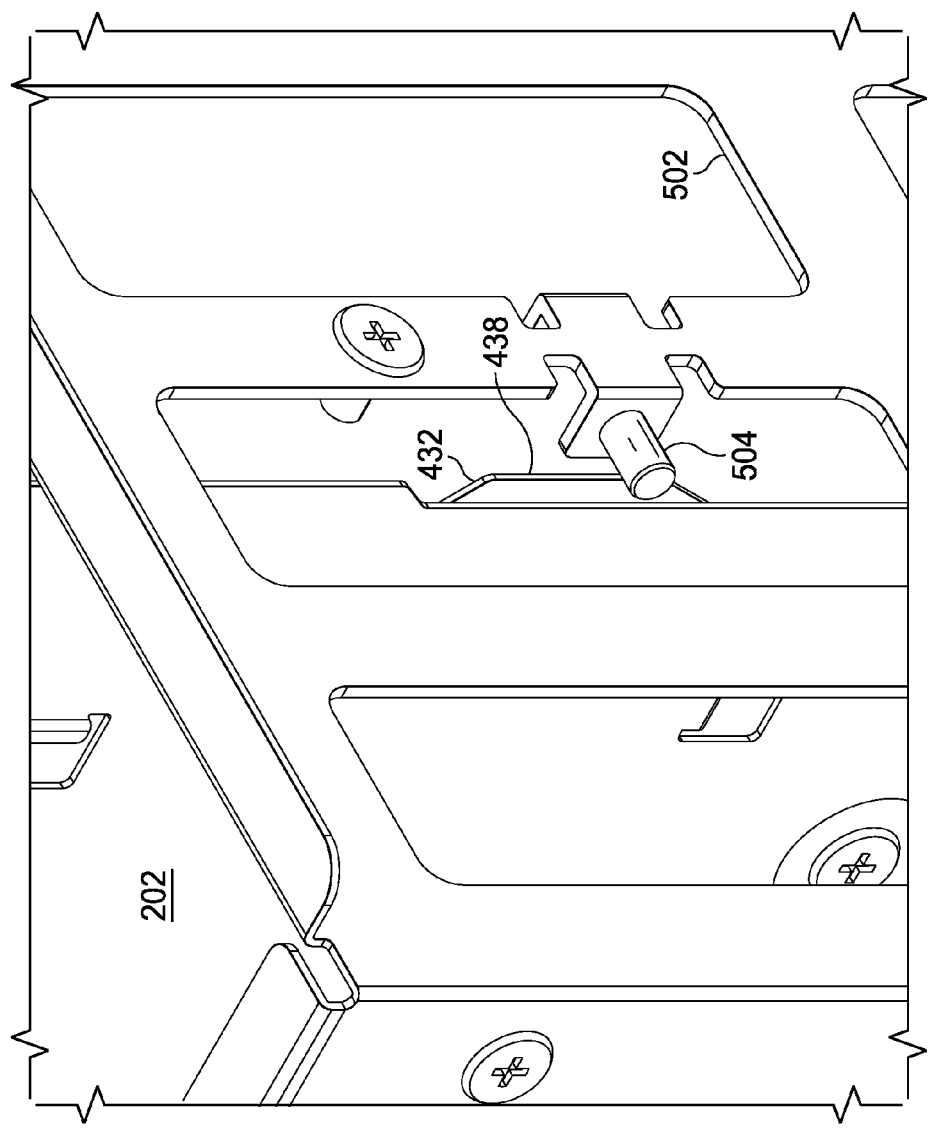
FIG. 6 illustrates a perspective view of selected portions of the memory riser assembly shown in FIGS. 2-4 and selected portions of a slot for receiving the memory riser assembly, in accordance with embodiments of the present disclosure.

FIGS. 5A-5G depict example insertion of a memory riser assembly 200 into a corresponding bay 502, in accordance with embodiments of the present disclosure. For purposes of clarity and exposition, certain features (e.g., e.g., memory riser 114 and memory module cover 204) are omitted from FIGS. 5A-5G. In FIG. 5A, memory riser assembly 200 is shown partially disposed in a bay 502, with handle 218 fully withdrawn relative to base 216 such that lockout arms 433 are in their biased positions and cause first ends 436 of each associated lockout arm 433 to engage with lockout features (e.g., edges 442) of a corresponding handle arms 404, preventing closure of handle 218 relative to base 216. As shown in FIG. 5B and in a perspective view in FIG. 6, as memory riser assembly 200 is inserted further into bay 502, one or more lock-releasing features 504 (e.g., posts extending from chassis 100) may each engage with a corresponding second end 438 of a lockout arm 433, in order to overcome the spring force of spring 440, thus causing first end 436 to disengage from the lockout feature (e.g., edge 442) of handle 218 such that handle 216 may be translated relative to base 218.

Figure 7:
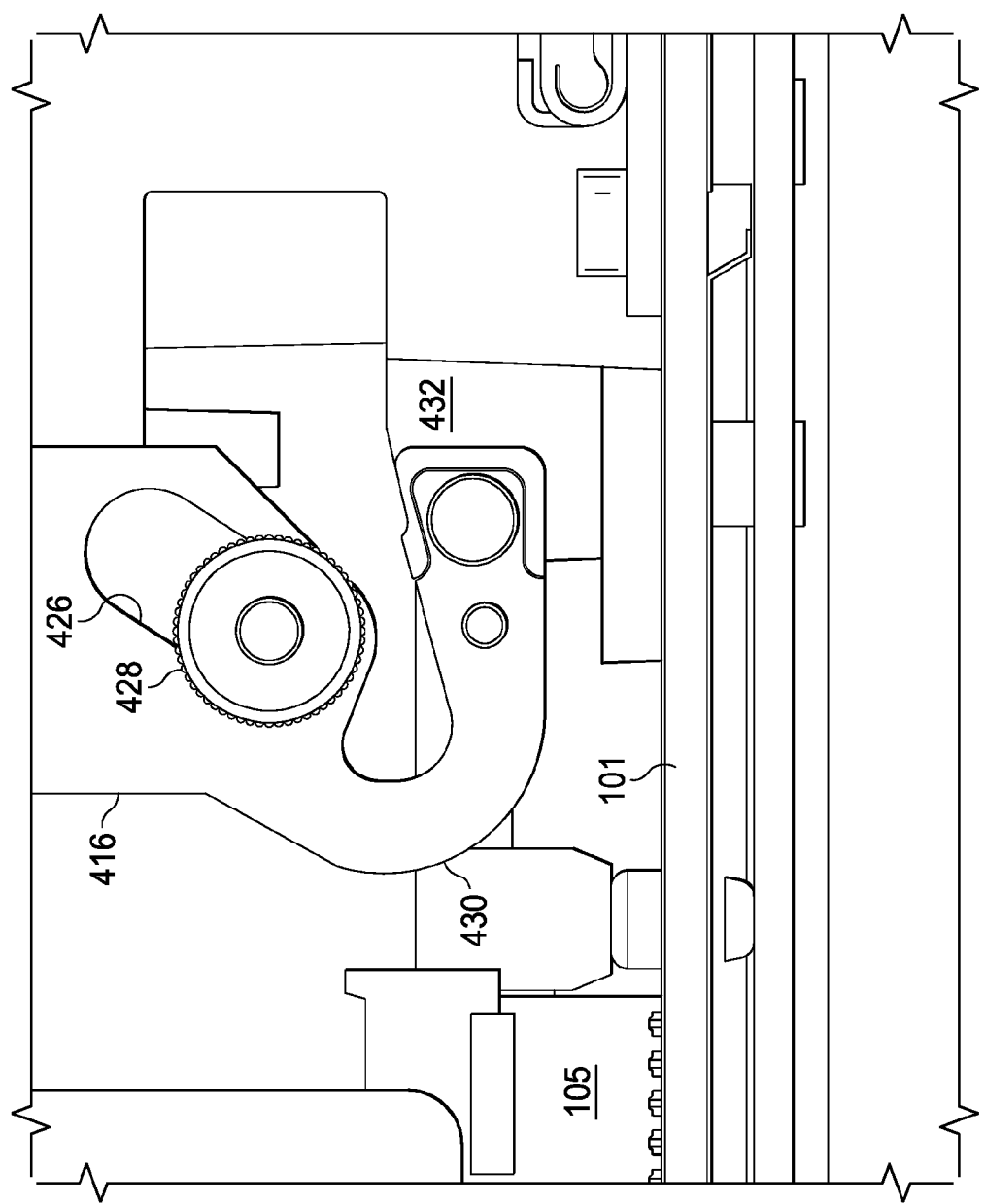
FIG. 7 illustrates an elevation view of a leg of the memory riser assembly shown in FIGS. 2-4 engaging with a retention structure, in accordance with embodiments of the present disclosure.

As handle 218 is translated from its open position to its closed position relative to base 216, drive slots 406 of handle 218 may cause rotation of L-shaped arms 410 about rotational pivots 412, which in turn may cause legs 430 of cam links 416 to engage with corresponding retention structures 432 mechanically coupled to motherboard 101. FIG. 7 illustrates engagement of a leg 430 with a corresponding retention structure 432, in accordance with embodiments of the present disclosure. FIGS. 5C-5G incrementally depict translation of handle 218 from its open position to its closed position relative to base 216 and the motion of L-shaped arms 410 and cam links 416 in response thereto. During insertion of memory riser assembly 200, edge connector 214 of memory riser 114 may engage with and mechanically and electrically couple to slot 105.

As shown in the figures, including FIG. 7, leg 430 may have an arc shape, which may deflect during high mechanical loading of cam link 416 that may occur to varied manufacturing tolerances of bays 502, slots 105, and/or memory riser assemblies 200. Such ability of leg 430 to deflect in response to mechanical stresses may prevent mechanical overloading to a slot 105 and/or connector 214.

Figure 8A:
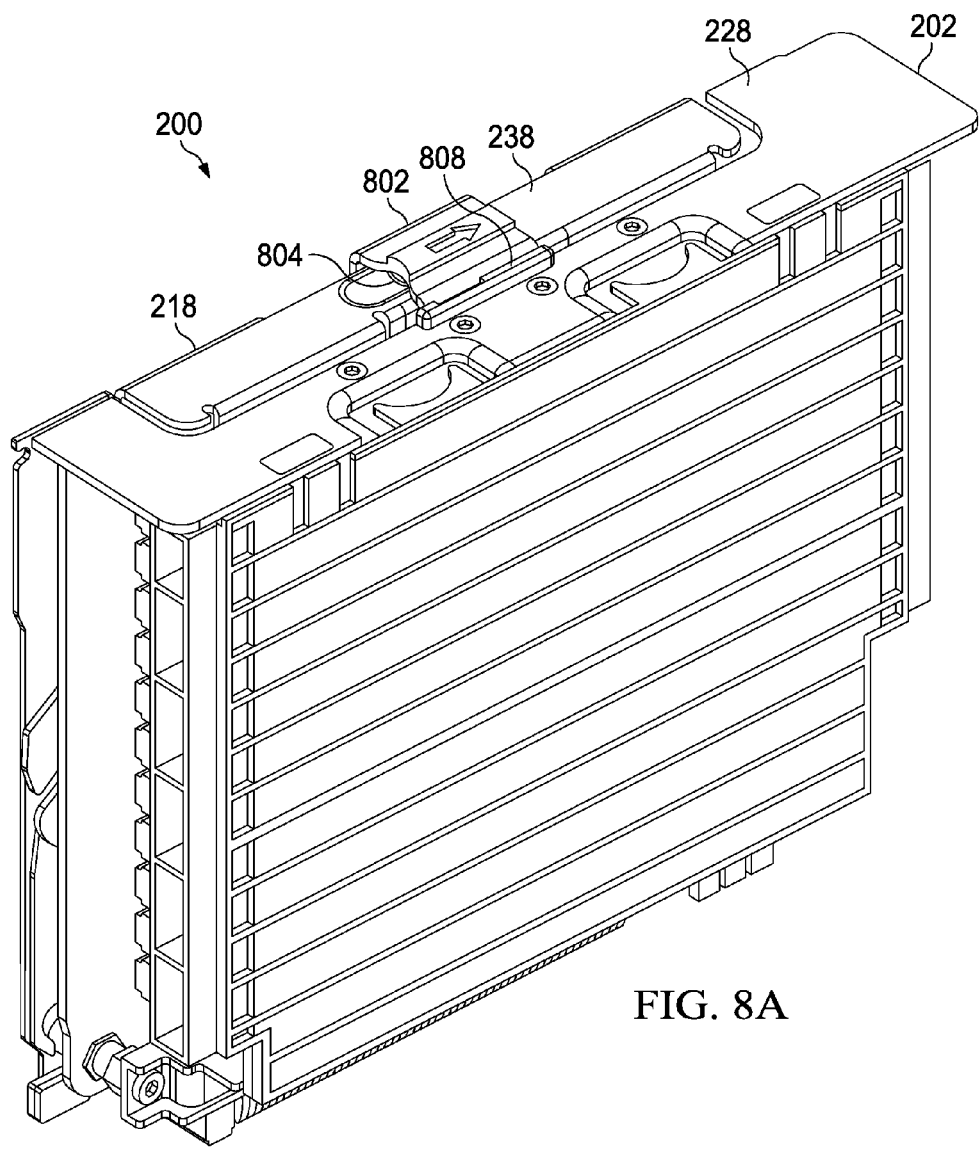
FIGS. 8A and 8B illustrate a handle release mechanism of the memory riser assembly shown in FIGS. 2-4, in accordance with embodiments of the present disclosure.
Figure 8B:
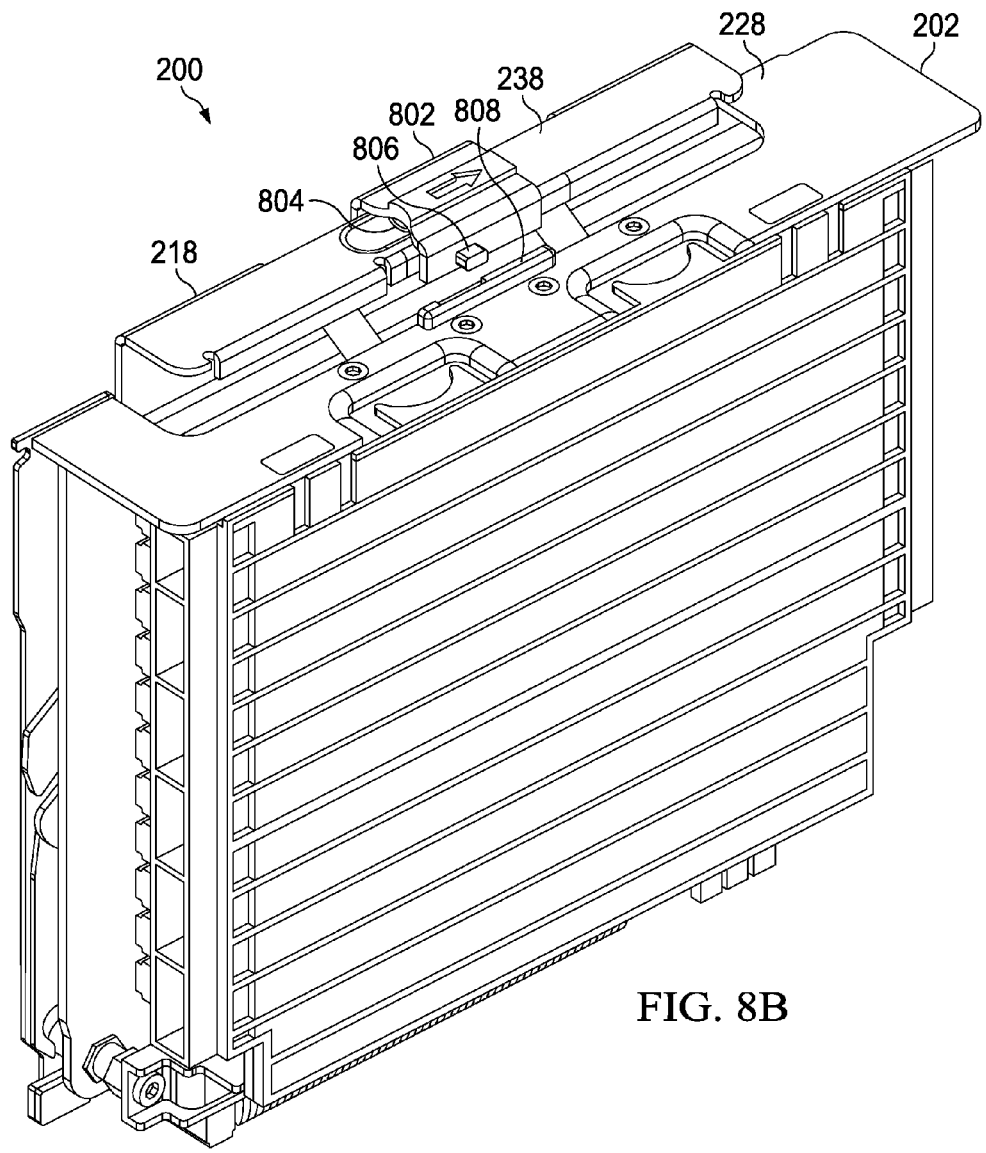

FIGS. 8A and 8B illustrate a handle release mechanism of memory riser assembly 200, in accordance with embodiments of the present disclosure. As shown in FIGS. 8A and 8B, handle 218 of memory riser tray 202 may include a slidable handle release 802 which may be slidable in a direction substantially parallel to face 238. Handle release 802 may be coupled to the remainder of handle 218 via a spring 804 which may bias handle release 802 in a biased position. A technician or other user may interact with handle release 802 to slide it from its biased position, which may cause tab 806 of handle release 802 to disengage from tab retention feature 808. When handle release 802 is in its biased position with handle 218 in its closed position, tab 806 may interact with tab retention feature 808 to oppose a spring force of one of more springs 444 (shown in FIG. 4) which may bias handle release 802 into at least a partially open position. Thus, when tab 806 disengages with tab retention feature 808, handle 218 may spring into an open position in a direction substantially perpendicular to the direction in which handle release 802 slides. Thus, due to handle release 802 being integrated into handle 218, a technician or other user may maintain contact with handle 218 as it is released by handle release 802. In addition, because handle release 802 travels in a direction orthogonal to that of handle 218, interaction of a user with handle release 802 may not itself impede or conflict with translation of handle 218. As a result of the user being able to remain in contact with handle 218 while releasing it, the user may control the spring-loaded release of handle 218, rather than handle 218 forcefully springing open.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. An information handling resource assembly comprising:
   a riser assembly suitable for being received in a bay of an information handling system chassis, the riser assembly comprising:
   a riser board wherein a primary side of the riser board includes slots for receiving information handling resource modules and wherein an integrated circuit is affixed to secondary side of the riser board;
   a riser caddy, comprising:
      a base comprising a structural element affixed to and mechanically supporting the riser board wherein the secondary side of the riser board faces, and is substantially parallel with, a primary side of the base structural element; and
      a handle, coupled to the base, configured to insert the riser board into the bay and remove the riser board from the bay; and
   a heat pipe assembly mechanically coupled to the secondary side of the base wherein the heat pipe assembly includes a thermally conductive heat pipe thermally coupled to the integrated circuit.

2. The system of claim 1, wherein a primary side of the handle faces, and is substantially parallel to the secondary side of the base.

3. The system of claim 1, wherein the handle comprises a U-shaped handle defining a central void and wherein the heat pipe assembly is affixed to the base within a central region of the base defined by projecting the central void onto the base.

4. The system of claim 3, wherein the central region of the base includes an opening aligned to the integrated circuit affixed to the riser board.

5. The system of claim 4, wherein the heat pipe assembly includes a thermally conductive block mechanically affixed to the heat pipe and aligned to the opening of the base, wherein the thermally conductive block is sized in accordance with the integrated circuit to form a thermally conductive interface between the integrated circuit and the heat pipe assembly.

6. The system of claim 4, wherein the base comprises a thermally conductive base and wherein the base dissipates heat from the heat pipe assembly.

7. The system of claim 1, wherein the riser board comprises a memory riser, the slots comprise slots for receiving memory modules, and the integrated circuit comprises a memory controller.

8. The system of claim 1, further comprising a heat sink protection screen mechanically coupled to the base such that the base and the heat sink protection screen physically enclose the heat pipe.

9. A method comprising:
providing a riser board wherein a primary side of the riser board includes slots for receiving information handling resource modules and wherein an integrated circuit is affixed to a secondary side of the riser board;
affixing a base of a riser caddy to the riser board to provide a structural element mechanically supporting the riser board wherein the secondary side of the riser board faces a primary side of the base structural element; and
coupling a handle of the riser caddy to the base, wherein the handle is configured to insert the riser board into a bay of an information handling system chassis and remove the riser board from the bay; and
mechanically coupling a heat pipe assembly to the secondary side of the base wherein the heat pipe assembly includes a heat pipe thermally coupled to the integrated circuit.

10. The method of claim 9, wherein a primary side of the handle faces, and is substantially parallel to the secondary side of the base.

11. The method of claim 9, wherein the handle comprises a U-shaped handle defining a central void and wherein the heat pipe assembly is affixed to the base within a central region of the base defined by projecting the central void onto the base.

12. The method of claim 11, wherein the central region of the base includes an opening aligned to the integrated circuit affixed to the riser board.

13. The method of claim 9, wherein the heat pipe assembly includes a thermally conductive block mechanically affixed to the heat pipe and aligned to the opening of the base, wherein the thermally conductive block is sized in accordance with the integrated circuit to form a thermally conductive interface between the integrated circuit and the heat pipe assembly.

14. The method of claim 12, wherein the base comprises a thermally conductive base and wherein the base dissipates heat from the heat pipe assembly.

15. The method of claim 9, wherein the riser board comprises a memory riser, the slots comprise slots for receiving memory modules, and the integrated circuit comprises a memory controller.

16. The method of claim 9, further comprising mechanically coupling a heat sink protection screen to the structural element such that the structural element and the heat sink protection screen physically enclose the heat pipe.

17. An information handling system comprising:
a chassis comprising one or more bays each configured to receive an information handling resource assembly; and
a riser assembly disposed in one of the one or more bays, the riser assembly comprising:
a riser board wherein a primary side of the riser board includes slots for receiving information handling resource modules and wherein an integrated circuit is affixed to a secondary side of the riser board;
a riser caddy comprising:
a base comprising a structural element affixed to and mechanically supporting the riser board wherein the secondary side of the riser board faces a primary side of the base structural element; and
a handle, coupled to the base, configured to insert the riser board into a bay and remove the riser board from the bay; and
a heat pipe assembly mechanically coupled to the secondary side of the base wherein the heat pipe assembly includes a heat pipe thermally coupled to the integrated circuit.

18. The information handling system of claim 17, wherein the handle comprises a U-shaped handle defining a central void and the heat pipe assembly is affixed to the base within a central region of the base defined by projecting the central void onto the base and wherein the central region of the base includes an opening aligned to the integrated circuit affixed to the riser board.

19. The information handling system of claim 18, wherein the heat pipe assembly includes a thermally conductive block mechanically affixed to the heat pipe and aligned to the opening of the base, wherein the thermally conductive block is sized in accordance with the integrated circuit to form a thermally conductive interface between the integrated circuit and the heat pipe assembly.

20. The information handling system of claim 17, wherein the base comprises a thermally conductive base constructed of steel or aluminum and wherein the base dissipates heat from the heat pipe assembly.

* * * * *